US012610806B2

(12) United States Patent
Shen et al.

(10) Patent No.: US 12,610,806 B2
(45) Date of Patent: Apr. 21, 2026

(54) INTERCONNECT STRUCTURES WITH NITROGEN-RICH DIELECTRIC MATERIAL INTERFACES FOR LOW RESISTANCE VIAS IN INTEGRATED CIRCUITS

(71) Applicant: Intel Corporation, Santa Clara, CA (US)

(72) Inventors: Ming-Yi Shen, Portland, OR (US); Nita Chandrasekhar, Portland, OR (US); Blake Bluestein, Hillsboro, OR (US); Tiffany Zink, Sheridan, OR (US); Shaestagir Chowdhury, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 994 days.

(21) Appl. No.: 17/485,151

(22) Filed: Sep. 24, 2021

(65) Prior Publication Data

US 2023/0102711 A1     Mar. 30, 2023

(51) Int. Cl.
    *H01L 23/532*     (2006.01)
    *H01L 21/768*     (2006.01)
    *H01L 23/522*     (2006.01)

(52) U.S. Cl.
    CPC .. *H01L 23/53238* (2013.01); *H01L 21/76807* (2013.01); *H01L 21/76831* (2013.01); *H01L 21/76843* (2013.01); *H01L 21/76876* (2013.01); *H01L 23/5226* (2013.01); *H01L 23/53219* (2013.01); *H01L 23/53266* (2013.01)

(58) Field of Classification Search
    CPC ......... H01L 23/53238; H01L 21/76807; H01L 21/76831; H01L 21/76843; H01L 21/76876; H01L 23/5226; H01L 23/53219; H01L 23/53266; H01L 21/76825; H01L 21/76826; H01L 21/76828; H01L 23/53209; H01L 23/53242

See application file for complete search history.

(56) References Cited

U.S. PATENT DOCUMENTS 9,721,895 B1    8/2017  Yang
9,899,317 B1    2/2018  Clevenger et al.
(Continued)

OTHER PUBLICATIONS

Extended European Search Report from European Patent Application No. 22183221.5 notified Jan. 5, 2023, 7 pgs.
(Continued)

*Primary Examiner* — Ratisha Mehta
*Assistant Examiner* — Sophia W Kao
(74) *Attorney, Agent, or Firm* — Essential Patents Group, LLP

(57) ABSTRACT

Integrated circuit structures including an interconnect feature without a higher-resistance liner material. In absence of a liner, metal of low resistance directly contacts an adjacent dielectric material, enabling lower resistance interconnect. Even for low-k dielectric compositions, adhesion of the metal to the dielectric material is improved through the incorporation of nitrogen proximal to the interface. Prior to deposition of the metal upon a surface of the dielectric, the surface is exposed to nitrogen species to form a nitrogen-rich compound at the surface. The metal deposited upon the surface may then be nitrogen-lean, for example a substantially pure elemental metal or metal alloy.

12 Claims, 14 Drawing Sheets

(56)          References Cited

U.S. PATENT DOCUMENTS

| | | | |
|---|---|---|---|
| 2004/0084680 A1* | 5/2004 | Ruelke .............. | H01L 23/53295 |
| | | | 438/105 |
| 2012/0119302 A1* | 5/2012 | Pei .................... | H01L 21/76805 |
| | | | 438/586 |
| 2017/0338148 A1* | 11/2017 | Shusterman ...... | H01L 23/53252 |
| 2018/0061702 A1* | 3/2018 | Clevenger ......... | H01L 21/76814 |
| 2018/0308802 A1* | 10/2018 | West .................... | H01L 23/528 |
| 2019/0237340 A1* | 8/2019 | Yang ................ | H01L 21/32134 |
| 2022/0139772 A1* | 5/2022 | Jezewski ............ | H01L 23/5226 |
| | | | 257/758 |

OTHER PUBLICATIONS

Intention to Grant from European Patent Application No. 22183221.5 notified Jan. 12, 2026, 7 pgs.

* cited by examiner

301

341

342

450A

310

450A 330     660     330     660     330

310 y x

B                                                                B'

301

$D_0$

T2

330     660     660     450A

450B

330

T1

450A

450C

310

306

305 z

B                                                                B' x

701

701

701

741

742

850A

850A 330    660    330    660    330 y

B    B' x

701

D₀

T2    330    660    660    450A

450B

330

715

450A

310

305    306 z    B    B' x

INTERCONNECT STRUCTURES WITH NITROGEN-RICH DIELECTRIC MATERIAL INTERFACES FOR LOW RESISTANCE VIAS IN INTEGRATED CIRCUITS

BACKGROUND

Demand for higher performance integrated circuits (ICs) in electronic device applications has motivated increasingly dense transistor architectures. Interconnect parasitics become a greater challenge as the density of interconnect metallization structures keeps pace with transistor density. For example, the resistance-capacitance (RC) delay associated with interconnects of an IC increases with the density of the interconnects.

FIG. 1A illustrates a conventional interconnect structure that includes a metal line 101 within a first interconnect level. A transverse width of metal line 101 has some lateral critical dimension CD1. A dielectric material 102 is over metal line 101, and a via opening 103 is subtractively patterned through dielectric material 102 in the z-dimension to expose a portion of metal line 101. Via opening 103 has a depth Dv associated with the thickness of dielectric material 102. A diameter of via opening 103 has some lateral critical dimension CD2. Often, CD2 is made smaller than CD1 by an amount sufficient to ensure via opening 103 will land fully upon metal line 101. The ratio of depth Dv to CD2 is referred to as the aspect ratio of via opening 103. Metal line width CD1 scales down as metal line density increases with increasing transistor density, and so CD2 must also scale down and the aspect ratio of via opening 103 increases.

As further illustrated in FIG. 1B, via opening 103 and trench 106 is filled with one or more metals to form a metal line 108 that extends within the x-y plane to intersect conductive material in via opening 103 so that two interconnect levels are electrically connected. In this example, an interconnect liner material 105 is on surfaces of trench 106 and via 103 to improve adhesion of a fill metal 107 that would otherwise suffer delamination or other deleterious effects of poor adhesion with dielectric material 102. However, liner material 105 often has significantly higher electrical resistance than fill material 107. As structural dimensions scale, liner material 105 threatens to become a greater portion of an interconnect structure, leading to higher interconnect resistances.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1A:
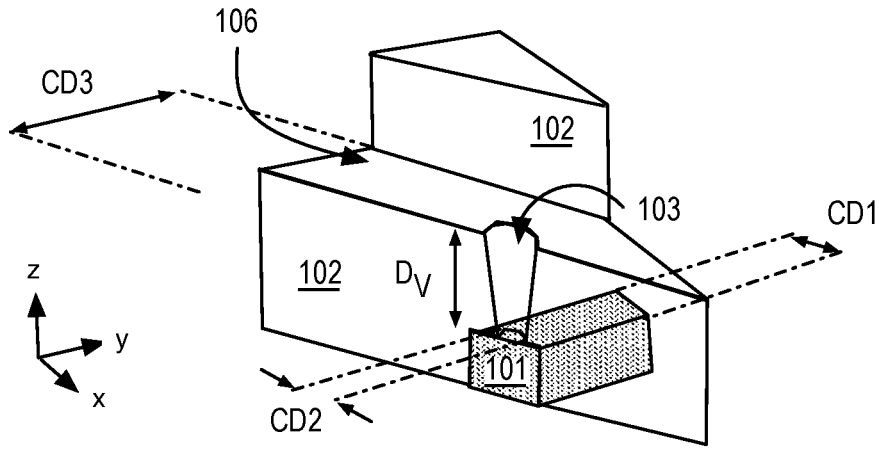
FIGS. 1A and 1B illustrate isometric cross-sectional views of an IC interconnect structure, in accordance with convention.
Figure 1B:
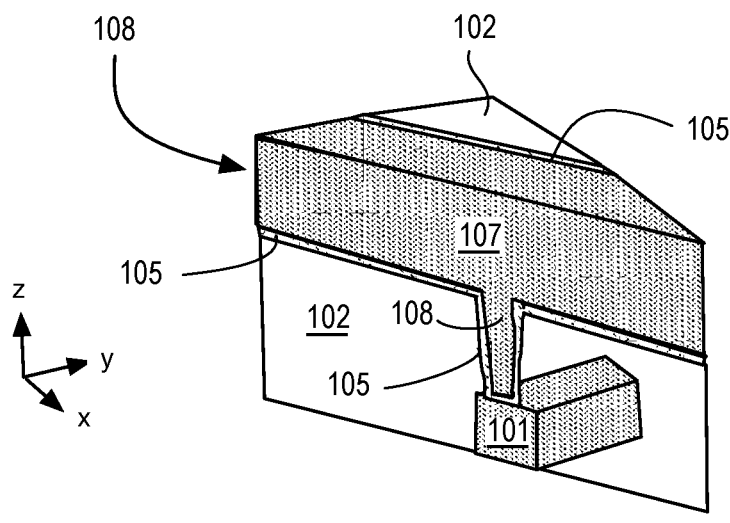

Embodiments are described with reference to the enclosed figures. While specific configurations and arrangements are depicted and discussed in detail, this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references (e.g., up, down, top, bottom, etc.) may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer disposed over or under another may be directly in contact or may have one or more intervening materials or layers. Moreover, one material disposed between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As used herein, the qualifier "substantially" is employed in the recognition that manufacturing processes output a population characterized by some distribution statistics. Unless explicitly stated otherwise, no more than incidental variation is to be expected between two things that are substantially the same.

Unless otherwise specified in the specific context of use, the term "predominantly" means more than 50%, or more than half. For example, a composition that is predominantly a first constituent means more than half of the composition is the first constituent (e.g., >50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <0.5 at. % of any other constituent. A composition that is substantially first and second constituents means the composition may further include <0.5 at. % of any constituent substituted for either the first or second constituent.

Described below are examples of integrated circuit (IC) structures having an interconnect feature, such as a line or a via, that includes a metal in direct contact with a dielectric material. Advantageous for highest electrical conductivity, the metal has a low concentration of impurities, such as nitrogen. In accordance with embodiments herein, the dielectric material is also of low nitrogen content, which may be advantageous for lowest relative permittivity. However, adhesion of the metal to the dielectric material is enhanced by introducing nitrogen into a surface thickness of the dielectric material. By treating only the surface of the dielectric material, nitrogen content may remain low within a majority of the dielectric material. Where the incorporation of nitrogen in the surface of the dielectric material improves adhesion sufficiently, interconnect features may be substantially linerless, or liner-free. In absence of any liner, an entirety of the metal in the interconnect feature may have high electrical conductivity.

As described below, one or more techniques may be integrated into a damascene metal interconnect process, or a subtractively patterned metal interconnect process, to introduce nitrogen into a dielectric material surface that will be in direct contact with a subsequently deposited metal. As such, a portion of the dielectric material, for example after via opening and/or trench patterning, may be modified for improved adhesion. A metal subsequently deposited, for example by physical vapor deposition (PVD) or chemical vapor deposition (CVD), may then bind more strongly to a nitrogen-based ligand (e.g., —NH) at the dielectric surface than in would otherwise to an oxygen-based ligand (e.g., —OH).

Figure 2:
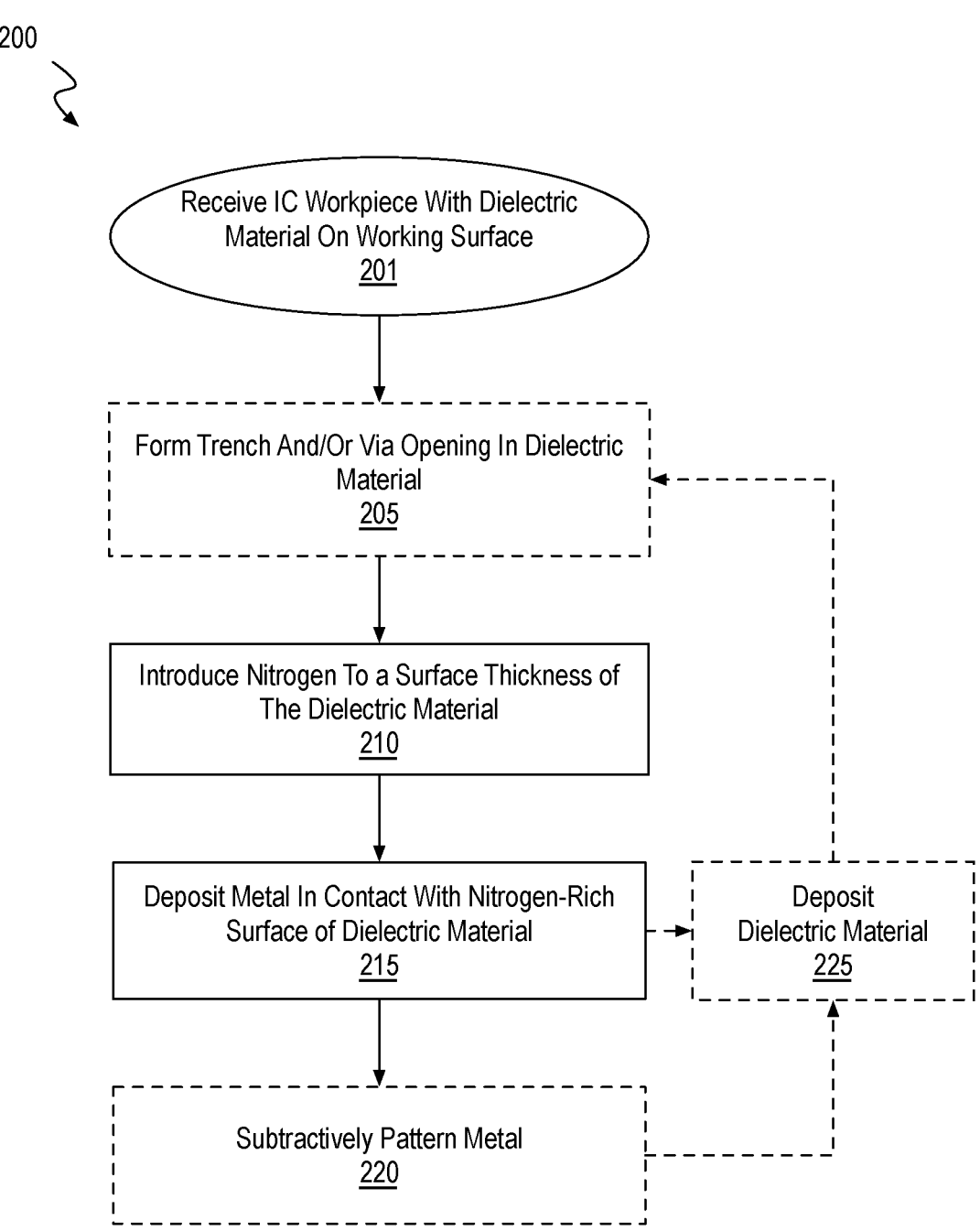
FIG. 2 is a flow chart of methods of fabricating one or more levels of interconnect structures with a metal directly contacting a nitrogen-enriched region of a dielectric material, in accordance with some embodiments.

FIG. 2 is a flow chart of methods 200 for fabricating one or more levels of an integrated circuit interconnect structure including a metal in direct contact with a nitrogen-enriched regions of a dielectric material, in accordance with some embodiments. Methods 200 begin at input 201 where a workpiece including a dielectric material is received. The workpiece may be as a large format (e.g., 300-450 mm) semiconductor wafer, for example. The wafer may include a Group IV semiconductor material layer (e.g., Si, Ge, SiGe, GeSn, etc.), a Group III-V semiconductor material layer, a Group II-VI semiconductor material layer, or the like. The workpiece may include one or more underlying device layers including a semiconductor material layer and may also have one or more interconnect levels interconnecting devices (e.g., transistors) of the device layer(s).

On a surface of the workpiece there is a dielectric material, which may have any chemical composition suitable for an IC interlayer dielectric (ILD). In advantageous embodiments, the dielectric material has a low nitrogen content (e.g., <<1 at. %) ensuring a low bulk relative permittivity. The dielectric material may be, for example, silicon-based with oxygen being another primary constituent. In some embodiments, the dielectric material may include $SiO_2$, and have a relative permittivity of about 3.5. However, in exemplary embodiments, the dielectric material has a low-k composition, for example having a relative permittivity less than 3.5, and more specifically in the range of 2.2-3.0. There are many such low-k dielectric materials, with several of them also including silicon and oxygen as primary constituents supplemented with various other constituents, such as carbon, and hydrogen, that stabilize a microstructure of lower density/greater porosity, etc.

In some damascene embodiments, methods 200 continue at block 205 where at least one of a trench or via opening is subtractively patterned into the dielectric material. The trench and/or via interconnect structure may be any "dual-damascene" or "single-damascene" type structure patterned into the dielectric material, for example. Block 205 is illustrated in dashed line to emphasize that the dielectric material need not be patterned, with block 205 skipped, for example if the dielectric material received at input 201 was planarized with a lower level of interconnect metal features upstream of methods 200.

In dual-damascene embodiments, both a trench and a via opening are patterned into the dielectric material at block 205. In single-damascene embodiments, only a via opening is patterned in a first iteration of block 205. The trench and/or via opening patterned at operation 205 may expose some underlying land, such as a lower-level interconnect metallization feature. For example, in some dual-damascene interconnect fabrication processes, the via opening, but not the trench, exposes some region of an underlying line or via of a lower-level interconnect structure, or exposes some region of an underlying device terminal metallization. In an exemplary single-damascene interconnect fabrication process, a via opening exposes some region of an underlying metallization via or line of a lower-level interconnect structure or exposes some region of an underlying device terminal metallization.

At block 210, a working surface of the dielectric material is exposed to a nitrogen species to incorporate nitrogen into a thickness of the dielectric material proximal to the surface. Advantageously, the nitrogen content is localized to the surface, maintaining a low relative permittivity throughout a remainder (bulk) of the dielectric material. For embodiments where the dielectric material is patterned at block 205, nitrogen is introduced through surfaces of the trench and/or via opening, as well as through a top surface of the dielectric material. In other embodiments, where the dielectric material is unpatterned, nitrogen is incorporated into only the top, planarized surface of the dielectric material.

In some exemplary embodiments, at block 210 the dielectric material surface(s) are exposed to a nitrogen species activated by energizing a nitrogen source gas with a direct or remote plasma. Nitrogen source gases, such as, but not limited to, $N_2$, $N_2O$, $NH_3$, $N_2H_4$, or $N_2$:$H_2$ (e.g., a 4% forming gas) may be energized with an RF or magnetron source, for example. In some other embodiments, block 210 entails exposing the dielectric material surface to a transient thermal process, such as, but not limited to, a flash anneal, laser anneal, or rapid thermal anneal, practiced in the presence of a nitrogen source gas, such as any of those described above. In some other embodiments, the dielectric material surface may be exposed to ion or electron beam irradiation in the presence of a nitrogen source gas, which may implant nitrogen into a surface thickness of the dielectric material. Notably, the methods practiced at block 210 do not deposit a thin film over the dielectric material, but rather modify the chemical composition of the existing dielectric material near the surface to be nitrogen-enriched.

Following nitrogen enrichment, at block 215 a metal is deposited directly upon the nitrogen-enriched dielectric material surface. The metal deposited is advantageously of low nitrogen content, for example to ensure high electrical conductivity. The metal may be deposited by any technique known to be suitable for the particular metal and/or capable of adequately filling any topographic features (e.g., via openings and/or trenches) in the dielectric material. In some exemplary embodiments, metal is deposited by PVD. In other embodiments, metal is deposited by CVD, or atomic layer deposition (ALD). An electrolytic plating process may also be practiced at operation 215. Although any metal may be deposited at block 215, in some advantageous embodiments the metal comprises predominantly one of Ru, Mo, or a NiAl alloy. In some advantageous embodiments, substantially pure Ru is deposited at block 215. In other advantageous embodiments, substantially pure Mo is deposited at block 215. In some other advantageous embodiments, NiAl alloy having a Nickel at. % of 40-70 is deposited at block 215. Regardless of the metal(s) deposited at block 215, the nitrogen content of the metal formed is advantageously below 1 at. %, and ideally comprises no more than a trace (e.g., below 0.3 at. %) of nitrogen.

In further embodiments, multiple deposition processes may be practiced at block 215. Deposition of the metal may comprise two or more of any of PVD, CVD, ALD, or electroless plating. For example, an electrolytic plating process may be preceded by physical vapor deposition (PVD) of a seed layer. Regardless of how many deposition processes may be practiced at block 215, various layers of metal deposited at block 215 may have substantially the same composition, or not.

For damascene embodiments, block 215 may be completed with a planarization (e.g., CMP) of the metal and the dielectric material, which exposes a top surface of the dielectric material surrounding metal within a trench or via opening. As described further below, the planarization process may remove the nitrogen-enriched region of the dielectric material beyond a perimeter of an interconnect structure, or not, depending on the amount of over polish.

For dual-damascene embodiments, methods 200 are substantially complete following block 215 with one level of interconnect metal fabricated. Methods 200 may be repeated for each successive interconnect level that is to include a dual-damascene interconnect structure. With each iteration, additional dielectric material may be deposited at block 225, for example with any CVD, plasma-enhanced (PE) CVD, or spin-on process known to be suitable for a dielectric material of a desired composition. In some embodiments, the dielectric material deposited at block 225 has substantially the same composition as the dielectric material received on the workpiece at input 201.

Alternatively, in single-damascene embodiments where only a via opening is filled at operation 215, methods 200 continue with operation 225 where additional dielectric material is deposited over the via structure thus far formed. Methods 200 may then continue with a second iteration of operation 205, for example where a trench is formed in the dielectric material deposited at operation 225 to expose a portion of the interconnect via formed at block 215. Then, at another iteration of block 210, nitrogen may again be incorporated into a surface of the dielectric material deposited at operation 225. Hence, for single-damascene embodiments, two nitrogen pretreatment operations 210 may be performed to complete one interconnect level. Methods 200 may then complete with additional metal deposited again at block 215.

In some other embodiments where the metal deposited at block 215 is amenable to an etch process, the metal may be subtractively patterned at block 220. For example, Ru deposited at block 215, may be etched at block 220 with a plasma comprising $Cl_2$, or through an electrochemical atomic layer etch (EALE) process. For embodiments where the metal is subtractively patterned at block 220, nitrogen-enriched dielectric material may be retained only below the metal features. An overetch of the metal may, for example, remove nitrogen-enriched regions of the dielectric material adjacent to a metal feature. Following the subtractive etch process, methods 200 may continue at block 225 where additional dielectric material is deposited over, and adjacent to sidewalls of, the patterned metal feature. However, as described further below, an interface between a sidewall of the metal feature and this additional dielectric material will not be similarly nitrogen-enriched.

Embodiments of methods 200 are further described below in the context of FIG. 3A-10C. FIGS. 3A, 4A, 5A and 6A illustrate a plan view of a portion of an IC interconnect structure 301 evolving as the methods 200 are practiced, in accordance with some dual-damascene embodiments. FIGS. 3B, 4B, 5B and 6B further illustrate a cross-sectional view of a portion of IC interconnect structure 301 evolving, in accordance with some dual-damascene embodiments.

Figures 3A, 3B:
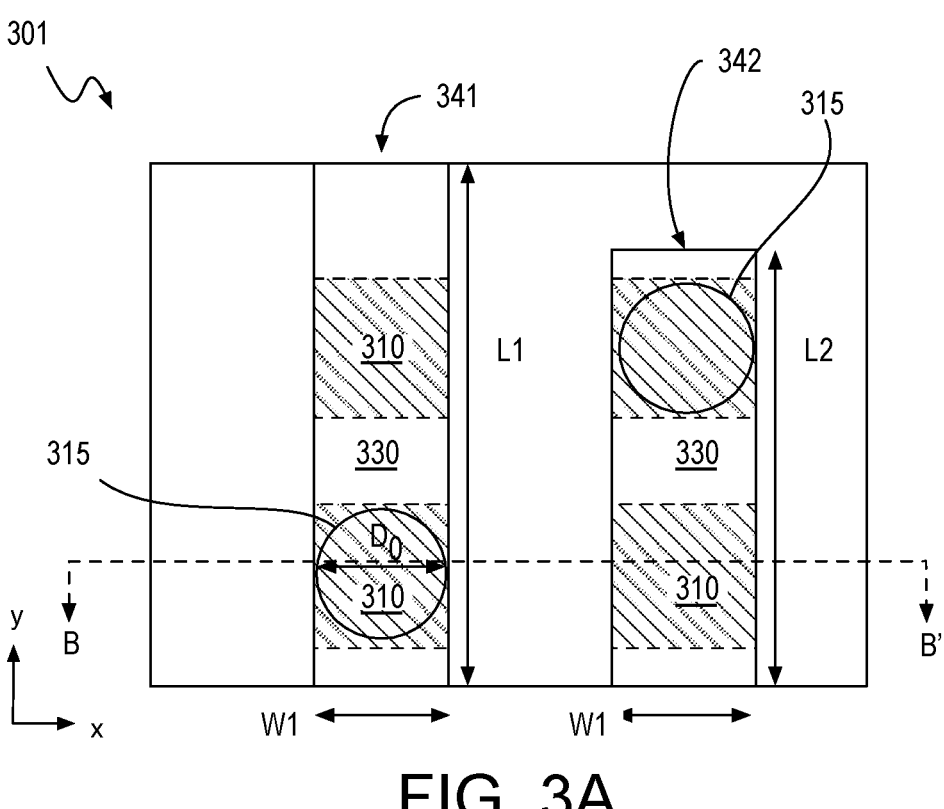
FIGS. 3A and 4A illustrate a plan view of a portion of an IC interconnect structure evolving as the methods illustrated in FIG. 2 are practiced, in accordance with some dual-damascene embodiments.
FIGS. 3B and 4B illustrate a cross-sectional view of a portion of an IC interconnect structure evolving as the methods illustrated in FIG. 2 are practiced, in accordance with some dual-damascene embodiments.

Referring first to FIG. 3A and FIG. 3B, interconnect structure 301 includes a via opening 315 through a thickness T1 of a material 330. Thickness T1 may vary with implementation, but in some exemplary embodiments is 10 nm-50 nm. An underlying metallization feature (e.g., a line) 310 is exposed at a bottom of via opening 315. Metallization feature 310 is in a lower interconnect level below dielectric material 330. Metallization feature 310 may have any composition, with some examples including copper, tungsten, titanium, molybdenum, cobalt, ruthenium, ruthenium-cobalt alloy, or a nickel-aluminum alloy. In FIG. 3A, portions of metallization feature 310 outlined in dashed line are below the working surface.

Interconnect structure portion 301 further includes trench 341 over via opening 315, within a thickness T2 of dielectric material 330. Thickness T2 may vary with implementation, but in some exemplary embodiments is 10-50 nm, or more. Another trench 342 laterally spaced apart from trench 341 is further illustrated, and the cross-section of trench 342 shown in FIG. 3B is representative of a cross-section of trench 341 out of the plane of the FIG. 3B where there is no via opening 315. As shown in FIG. 3A, trench 341 has a longitudinal length $L_1$ and a transverse width $W_1$. In exemplary embodiments, longitudinal length $L_1$ is significantly (e.g., 3×) larger than transverse width $W_1$ Via opening 315 has a maximum lateral diameter $D_0$, which may vary with implementation, but is generally significantly smaller than the length of a trench (e.g., diameter $D_0$ is significantly smaller than longitudinal lengths $L_1$ and $L_2$). Trench 341 has ends somewhere beyond the perimeter of the portion of interconnect structure 301 illustrated. Trench 342 is substantially parallel to trench 341, but with a shorter longitudinal length $L_2$ to further illustrate a trench end.

Although not illustrated, there may be an etch stop material layer over dielectric material 330, surrounding trenches 341, 342. An etch stop material layer may also be present between the thickness T1 and thickness T2 of dielectric material 330, and is represented in FIG. 3B by a dashed line. Although such etch stop layers may have a different chemical composition than dielectric material 330, the film thickness of any such etch stop layers is much smaller than thicknesses T1 and T2, and so is ignored for the sake of clarity.

Any single-step or multi-step reactive ion etch (RIE) process (e.g., based on a $C_xF_y$ plasma chemistry) may define trenches 341, 342 and via opening 315, as embodiments are not limited in this respect. Trenches 341, 342 and via opening 315 are depicted with a tapered sidewall and positive slope such that a top width of via opening 315 having feature diameter $D_0$ is slightly larger than the bottom width. While such tapered slope is representative of typical subtractively patterned dielectrics, other profiles are possible as a function of the dielectric etch process.

Dielectric material 330 may include any dielectric material suitable for electrical isolation of integrated circuitry. Dielectric material 330, may be a low-k dielectric material having a relative permittivity below 3.5, for example. In some examples, dielectric material 330 comprises both silicon and oxygen, and may be any of $SiO_2$, hydrogen silsesquioxane, or methyl silsesquioxane, for example. In further embodiments, dielectric material 330 comprises significantly less nitrogen than oxygen, and advantageously has a nitrogen content less than 1 at. %, with ideally no more than a trace amount of nitrogen (e.g., <0.3 at. %). Dielectric material 330 may be deposited as a flowable oxide, for example, and/or may be otherwise planarized to have a substantially planar top surface 311.

As further shown in FIG. 3B, interconnect structure portion 301 is over a portion of an underlying substrate that includes a device layer 305. A plurality of devices 306 is within device layer 305. In exemplary embodiments, devices 306 are metal-oxide-semiconductor field effect transistor (MOSFET) structures. However, devices 306 may also be other transistor types, such as, but not limited to other FET architectures, thin film transistors (TFTs), or tunnel FETs (TFETS), etc. Devices 306 may also be devices other than transistors that may, for example, include one or more semiconductor junctions (e.g., diodes, etc.).

Figures 4A, 4B:
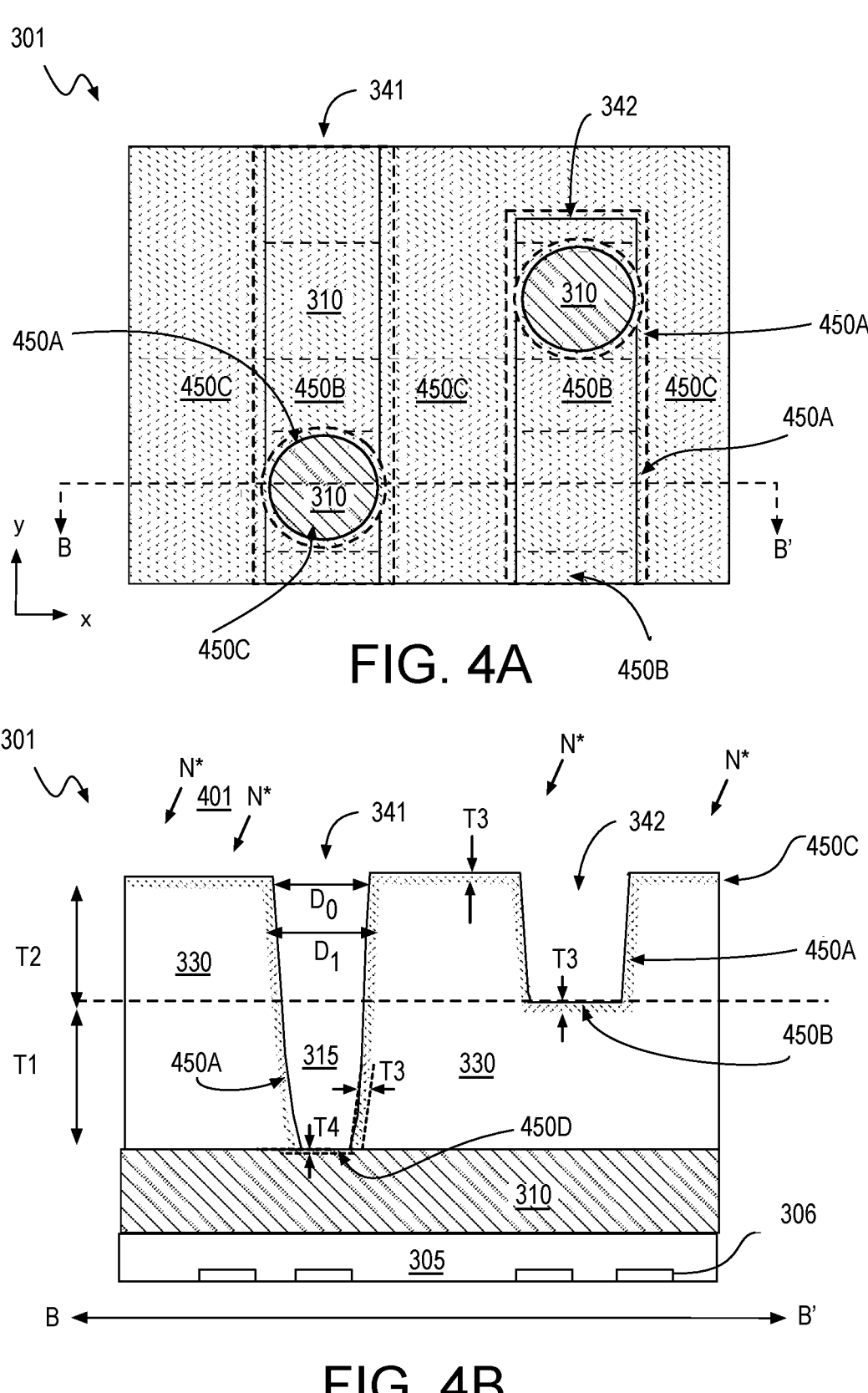

In the example further illustrated in FIG. 4A and FIG. 4B, surfaces of dielectric material 330 are exposed to nitrogen species 401, activated for example by plasma, a transient thermal process, or ion/electron beam radiation. The nitrogen enters dielectric material 330 and reacts with constituents, such as silicon and hydrogen, of dielectric material 330 to form compounds containing nitrogen (e.g., saturated and/or unsaturated amine and/or amide groups, such as —N, —NH, —NH$_2$, —CON, CONH, —CONH$_2$).

As shown, nitrogen enters dielectric material 330 to form a nitrogen-enriched dielectric sidewall region 450A within both trench 342 and via opening 315. In contrast to a thin film deposition, nitrogen treatment of dielectric 330 therefore retains feature diameter $D_0$, with nitrogen entering dielectric 330 to some treated diameter D1, larger than feature diameter $D_0$. The nitrogen-enriched sidewall dielectric region 450A has a thickness T3 within which the nitrogen concentration is higher than within other regions of dielectric material 330 unshaded in FIG. 4B. In some exemplary embodiments, thickness T3 is less than 10 nm (e.g., 5-8 nm). Nitrogen also reacts with dielectric material 330 to form a nitrogen-enriched trench bottom dielectric region 450B, which may also have the thickness T3. In the illustrated example, nitrogen also reacts with the planar top surface of the dielectric to form a nitrogen-enriched dielectric top surface region 450C, which may also have the thickness T3.

Nitrogen may also react with metallization feature 310, for example exposed at the bottom of via 315, to form a nitrogen-enriched metal region 450D. However, the reactivity of the nitrogen species with metallization feature 310 may be low as a result of the chemical composition of metallization feature 310. Nitrogen-enriched metal region 450D may therefore be undetectable, or, if detectable, will typically have a lower peak nitrogen concentration than nitrogen-enriched trench bottom dielectric region 450B as well as a thickness T4 that is significantly less than thickness T3. For example, in some embodiments where thickness T3 is 5-8 nm, thickness T4 is only 1.5-3 nm. Although illustrated as continuous surface regions, nitrogen-enriched sidewall region 450A, nitrogen-enriched trench bottom dielectric region 450B, nitrogen-enriched dielectric top surface region 450C, and nitrogen-enriched metal region 450D may each be discontinuous.

Figure 4C:
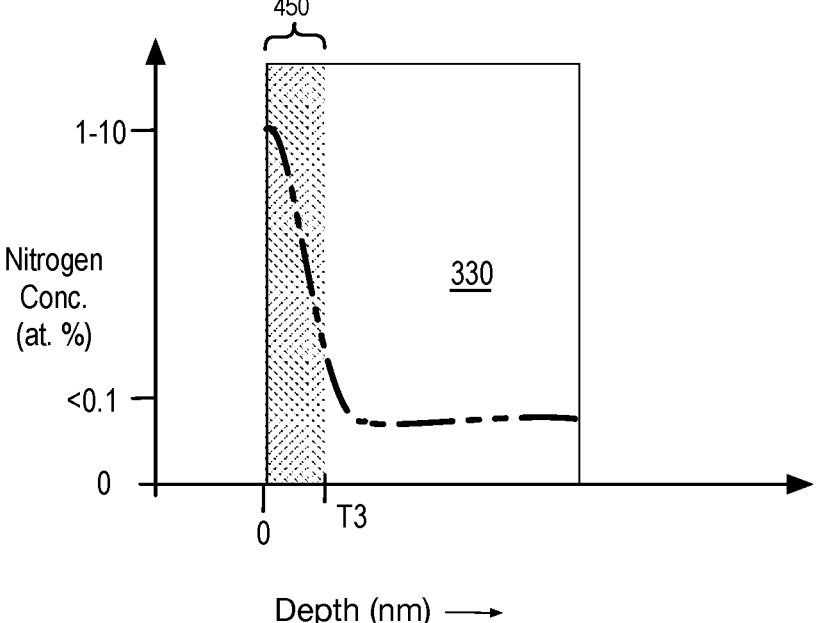
FIG. 4C is a graph illustrating a nitrogen concentration profile through a portion of a dielectric material in accordance with some embodiments.

FIG. 4C is a graph illustrating a nitrogen concentration profile through a portion of a dielectric material 330, in accordance with some embodiments. As shown, within nitrogen-enriched region 450 the nitrogen content increases with proximity to the surface (depth=0). In this example, at depths beyond thickness T3, the composition of dielectric material is substantially homogeneous and comprises only a trace of nitrogen (e.g., <0.3 at. %). The low, but non-zero, background nitrogen content of dielectric material 330 may be attributable to a precursor employed in the deposition of dielectric material 330, for example. Within thickness T3, nitrogen content increases monotonically from the background level to a concentration peak at the surface. In some embodiments, the peak concentration of nitrogen is less than 10 at. %, and may be, for example, between 1 at. % and 10 at. %. The monotonic increase in nitrogen content with proximity to the surface of dielectric material 330 illustrates a gradient distinct from the more abrupt transitions of a film stack comprising multiple dielectric layers of different nitrogen content, sequentially deposited for example.

Figure 5A:
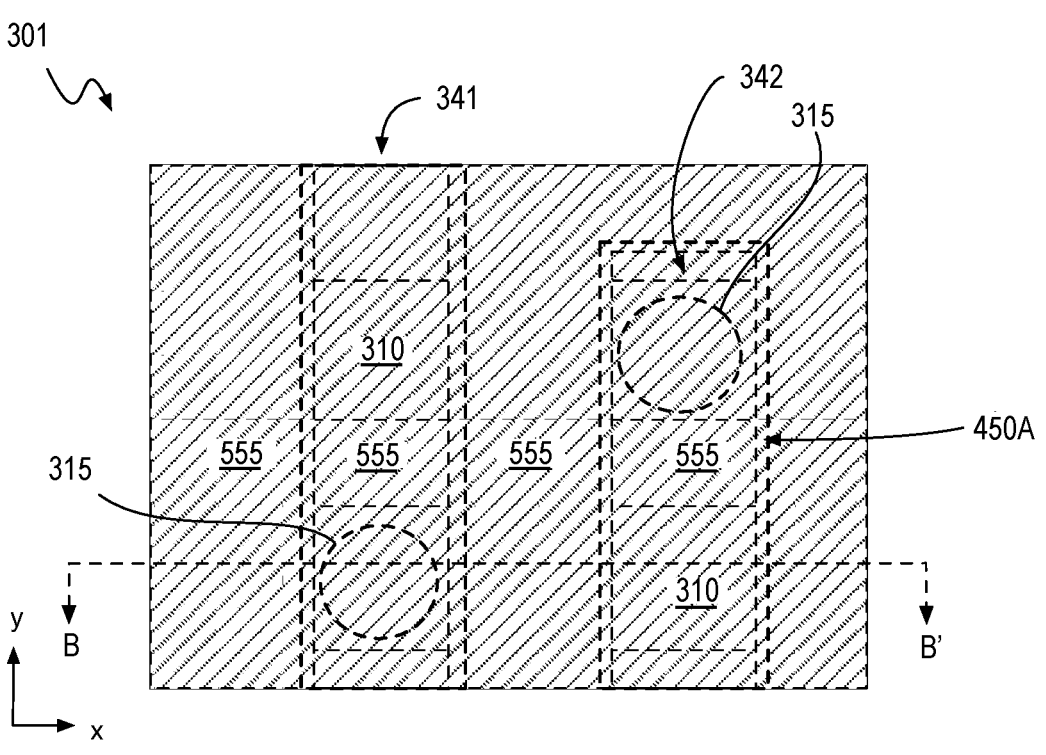
FIGS. 5A and 6A illustrate a plan view of a portion of an IC interconnect structure evolving as the methods illustrated in FIG. 2 are practiced, in accordance with some dual-damascene embodiments.
Figure 5B:
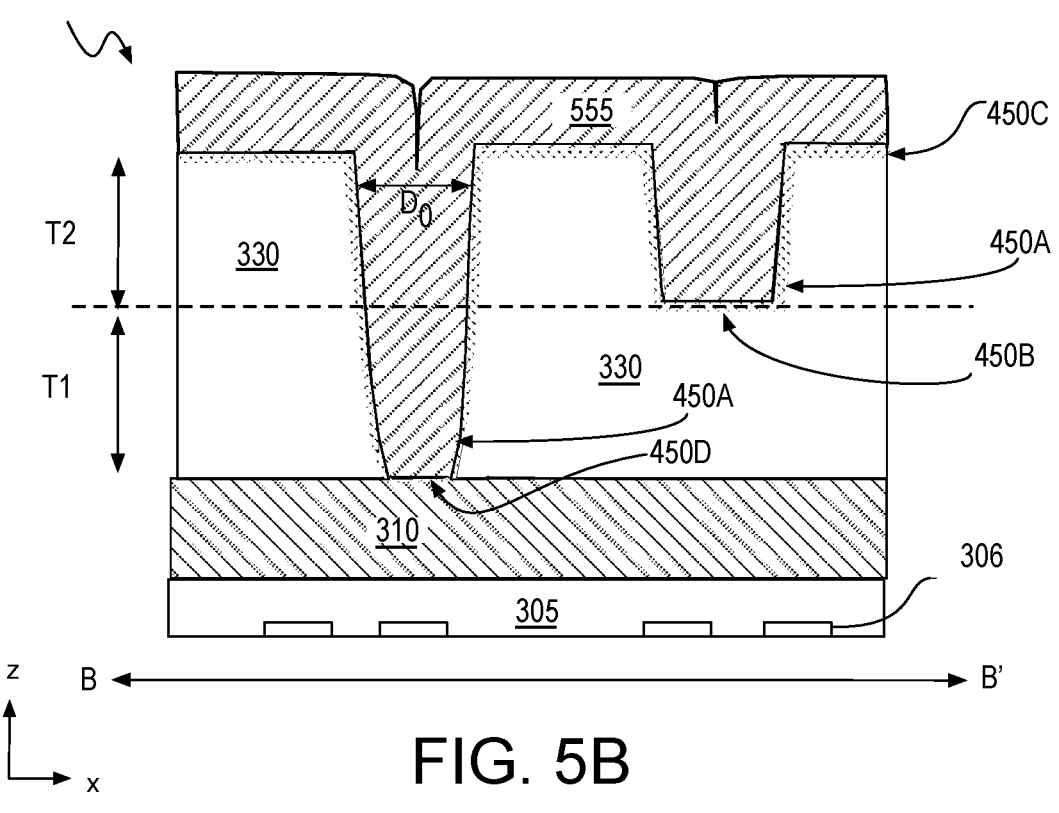
FIGS. 5B and 6B illustrate a cross-sectional view of a portion of an IC interconnect structure evolving as the methods illustrated in FIG. 2 are practiced, in accordance with some dual-damascene embodiments.

FIG. 5A and FIG. 5B further illustrate an example following deposition of an interconnect metal 555 by any technique suitable for the particular metal, such as PVD, CVD or ALD. Metal 555 is in direct physical contact with nitrogen-enriched regions of dielectric material 330. In this example, metal 555 completely fills via opening 315 and trenches 341, 342. In absence of any metal liner, metal 555 occupies the full feature diameter $D_0$. Several metals display higher binding energies with amine groups than hydroxyl groups and, although not bound by theory, the higher metal adhesion strength measured for embodiments herein may be attributable to these higher binding energies as the nitrogen surface treatment is thought to increase the amount of amine groups relative to hydroxyl groups at the surface of dielectric material 330.

As noted above, metal 555 may be one or more metals. In some exemplary embodiments metal 555 comprises Ru, Mo, or NiAl. Although alloys are possible, in some embodiments, metal 555 is substantially pure Ru having only trace impurities. In other examples metal 555 is substantially pure Mo having only trace impurities. In still other embodiments, metal 555 is a NiAl alloy. Regardless of the metal constituent(s), nitrogen content within metal 555 is advantageously low (e.g., less than 1 at. % and more advantageously less than 0.3 at. %).

Depending on the implementation, nitrogen treatment may be performed ex-situ of the deposition process employed to form metal 555, or performed as an in-situ nitrogen pretreatment where the treatment may be properly integrated into a metal deposition process.

As further illustrated in FIG. 5B, metal 555 is also in direct physical contact with metallization feature 310. For some embodiments where a nitrogen-enriched bottom metal region 450D is present, there will be an interconnect metal nitrogen content peak at the interface between the metal 555 and the underlying metal of feature 310 of lower nitrogen content. However, any nitrogen-enriched bottom metal region 450D should not significantly increase interconnect electrical resistance as the peak concentration is expected to be less than 10 at. %, and the thickness of nitrogen-enriched metal should be only a couple of nanometers.

Figure 6A:
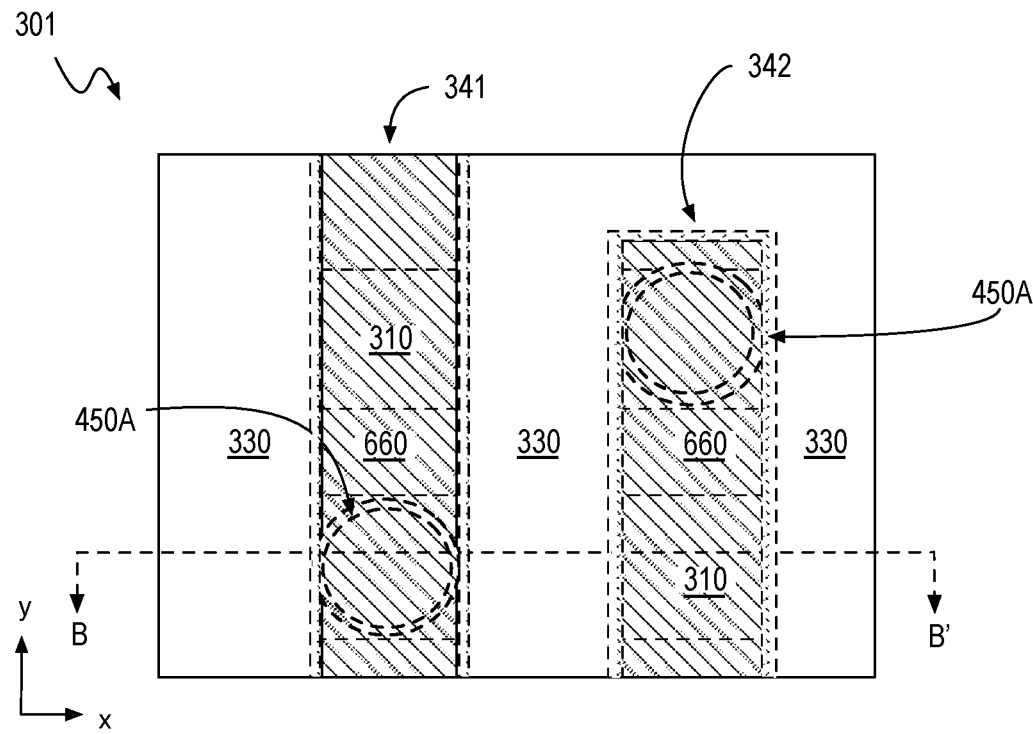
Figure 6B:
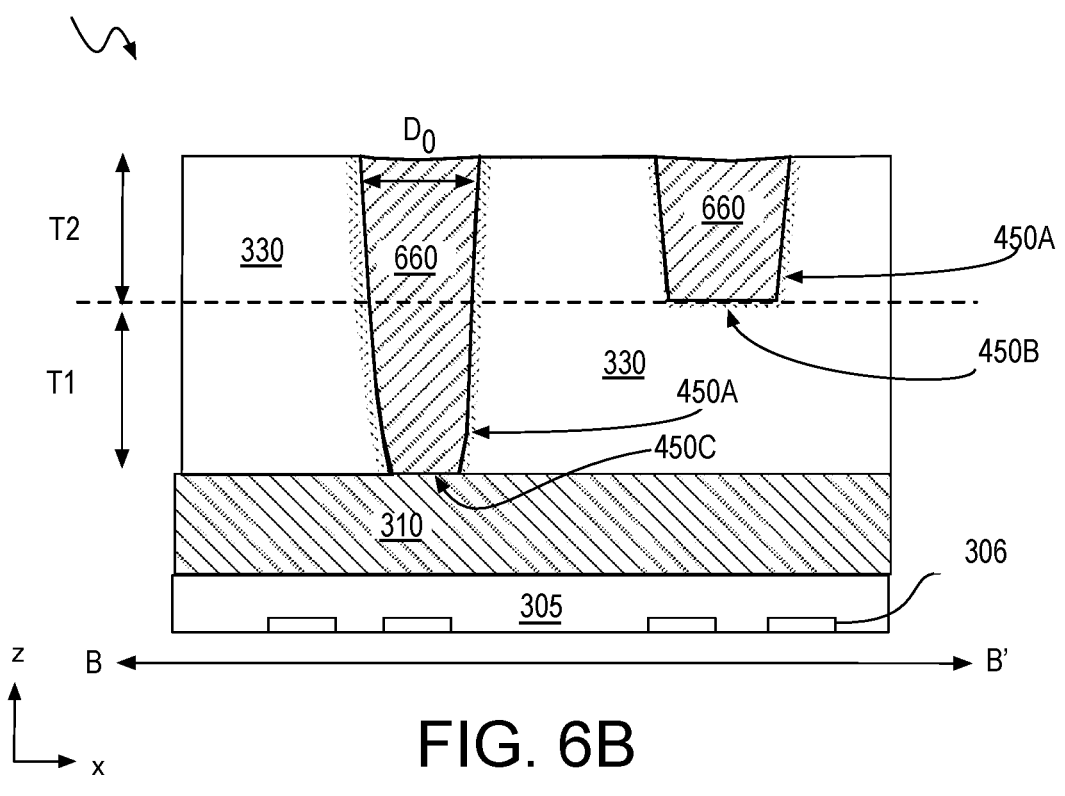

In the example further illustrated in FIG. 6A and FIG. 6B, metal 555 has been patterned into metal interconnect features 660 through a planarization process (e.g., CMP) that exposes a top surface of dielectric material 330. In the illustrated examples, metal interconnect feature 660 substantially backfills both via opening 315 as well as trenches 341, 342. In this example, an overpolish has removed nitrogen-enriched dielectric top surface region 450C. However, in other embodiments, a nitrogen-enriched dielectric top surface region 450C may remain after planarization. As illustrated in FIGS. 6A and 6B, interconnect structure 301 now includes one level of interconnect metallization comprising a linerless line metallization and linerless via metallization in direct contact with nitrogen-enriched dielectric regions 450A and 450B. Interconnect structure 301 may be augmented, for example by iterating through methods 200, to have any number of levels of interconnect metallization needed for a particular IC.

Figure 6C:
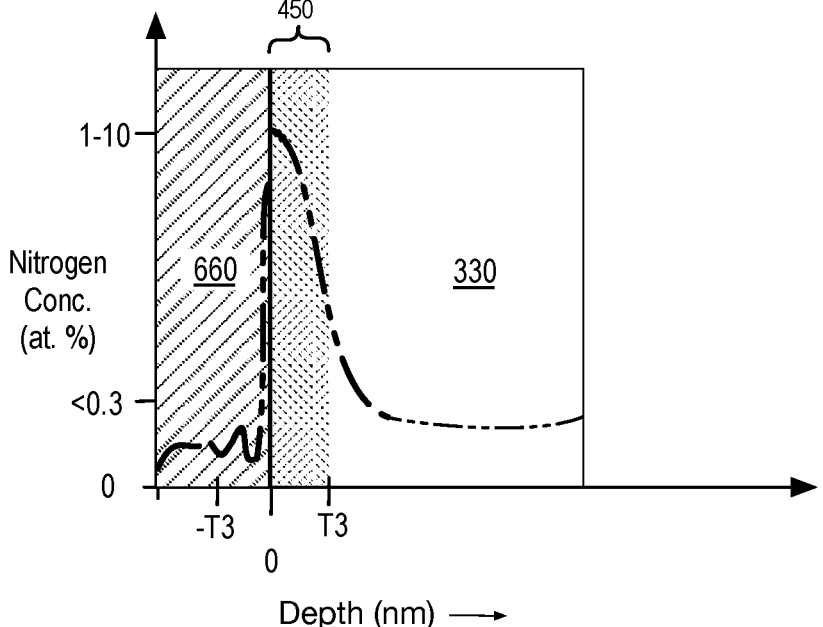
FIG. 6C is a graph illustrating a nitrogen concentration profile through a portion of a dielectric material and a metal interfacing to a nitrogen-enriched region of the dielectric material, in accordance with some embodiments.

FIG. 6C is a graph further illustrating a nitrogen concentration profile through a portion of dielectric material and metal interfacing the dielectric material, in accordance with some embodiments. The nitrogen concentration profile illustrated in FIG. 6C further demonstrates an exemplary embodiment where interconnect metal feature 660 has a low background level of nitrogen, far below the peak nitrogen concentration within the nitrogen-enriched dielectric region 450. In this example, the concentration of nitrogen within interconnect metal feature 660 is below 1 at. % even at the interface (depth=0) with the nitrogen enriched dielectric material. Moving away from the dielectric interface within metal feature 660, at a distance equal to thickness T3 (depth=−T3), nitrogen content is below the background level of nitrogen within dielectric material 330, with the exemplary metal having a trace level below 0.3 at. %.

Figure 7A:
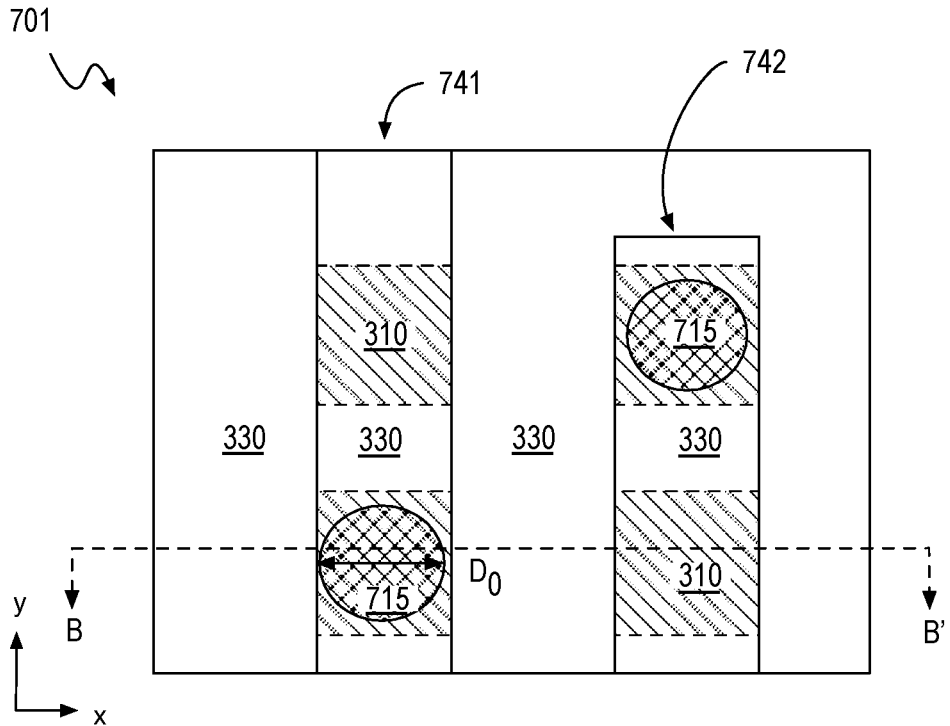
FIGS. 7A, 8A, and 9A illustrate a plan view of a portion of an IC interconnect structure evolving as the methods illustrated in FIG. 2 are practiced, in accordance with some single-damascene embodiments.
Figure 7B:
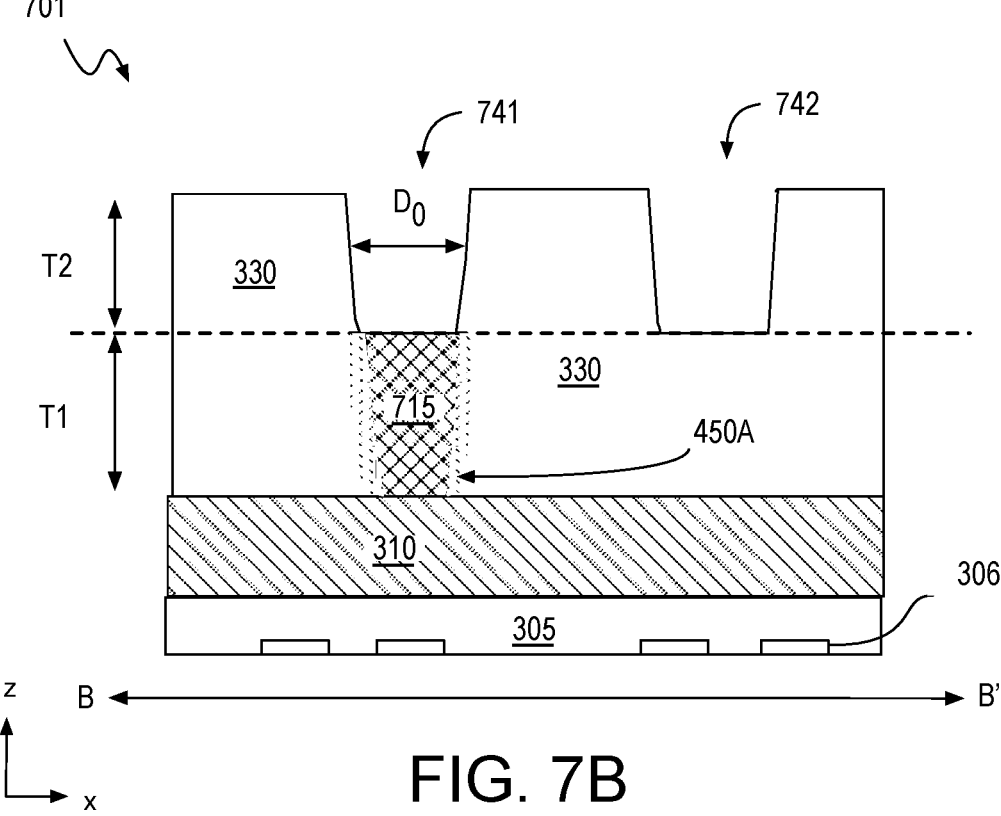
FIGS. 7B, 8B, and 9B illustrate a cross-sectional view of a portion of an IC interconnect structure evolving as the methods illustrated in FIG. 2 are practiced, in accordance with some single-damascene embodiments.
Figure 8A:
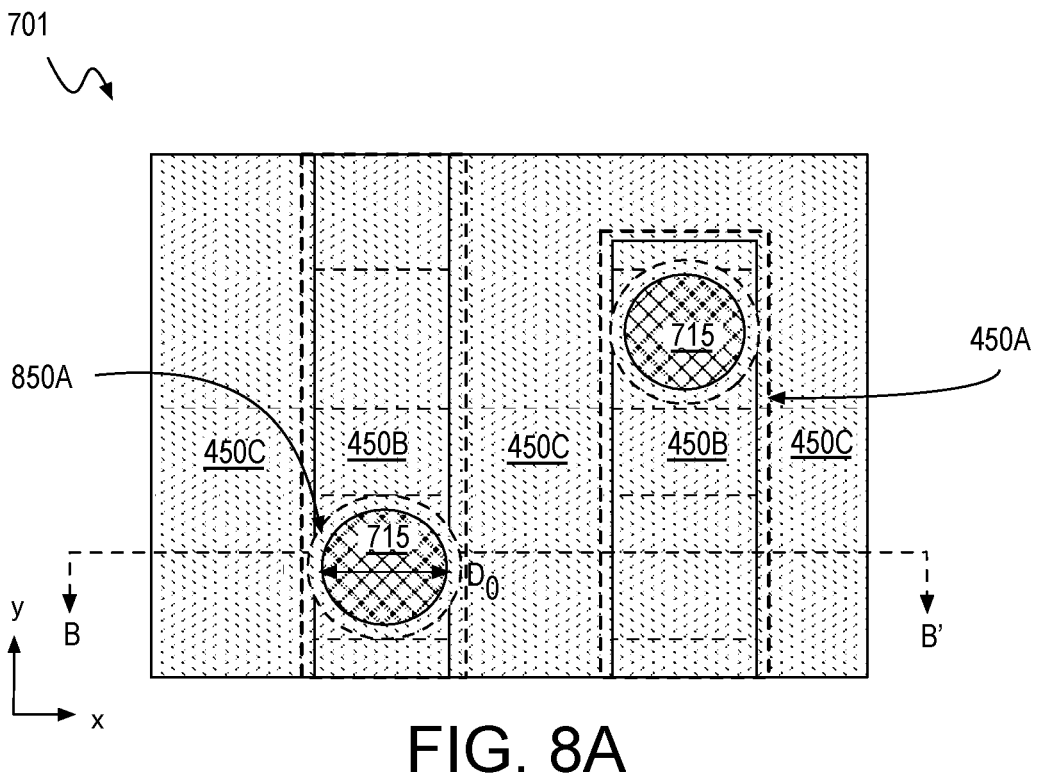
Figure 8B:
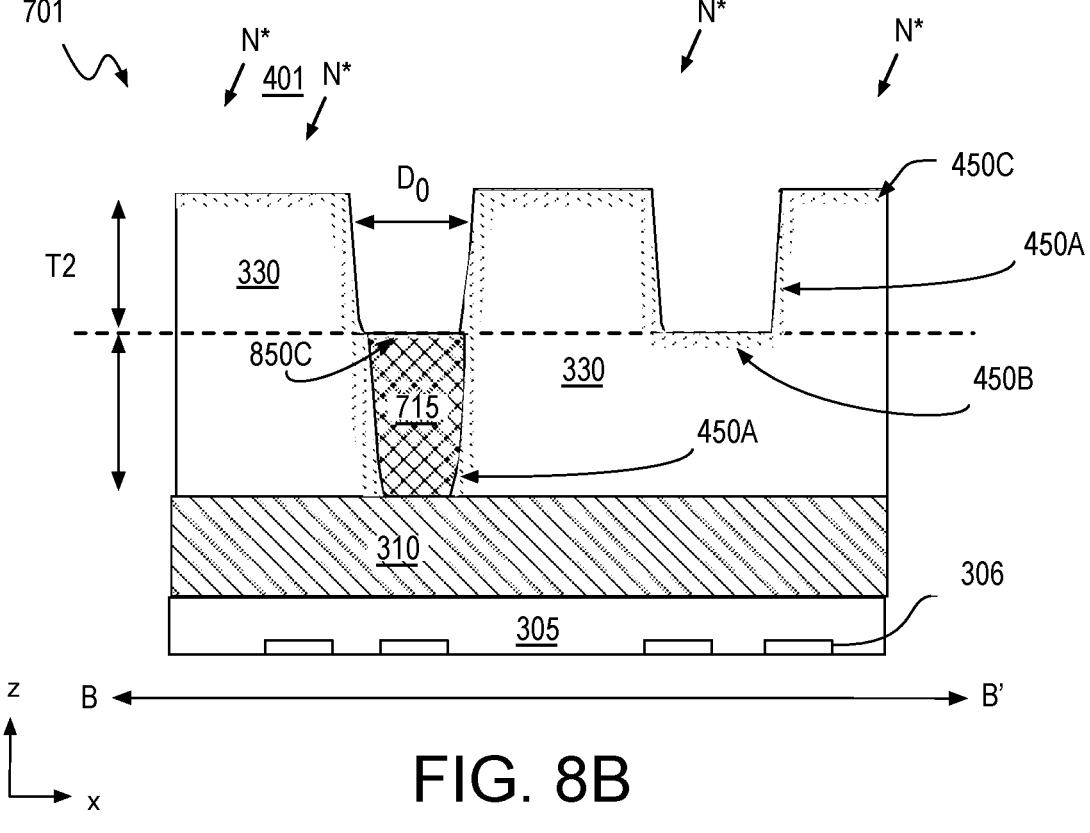
Figure 9A:
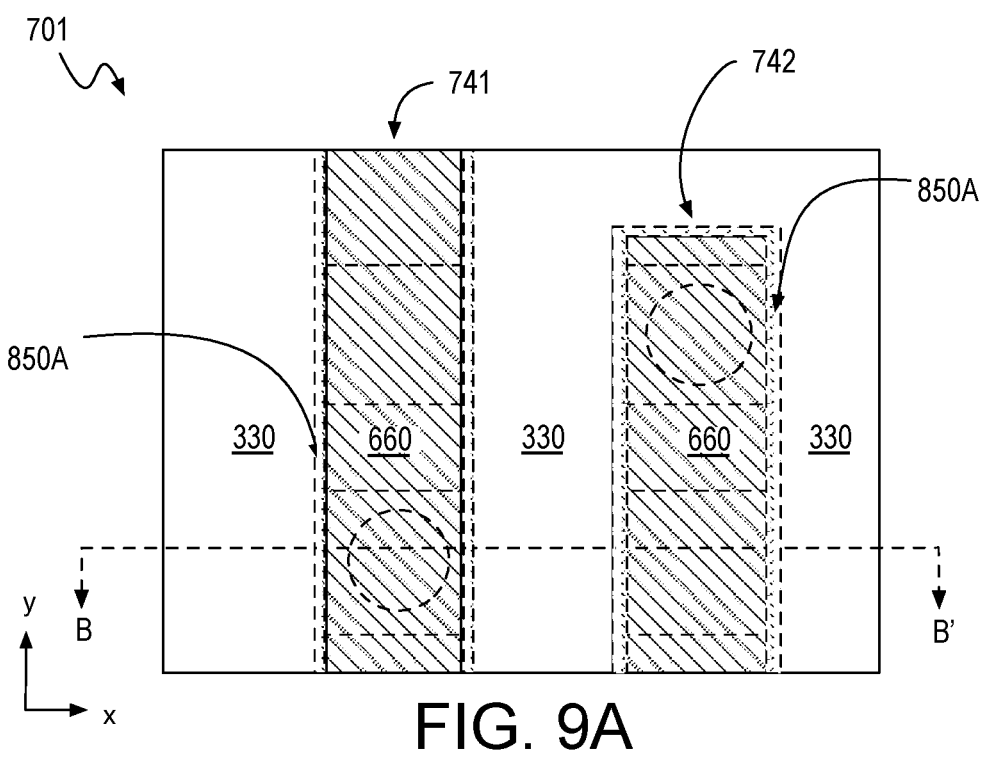
Figure 9B:
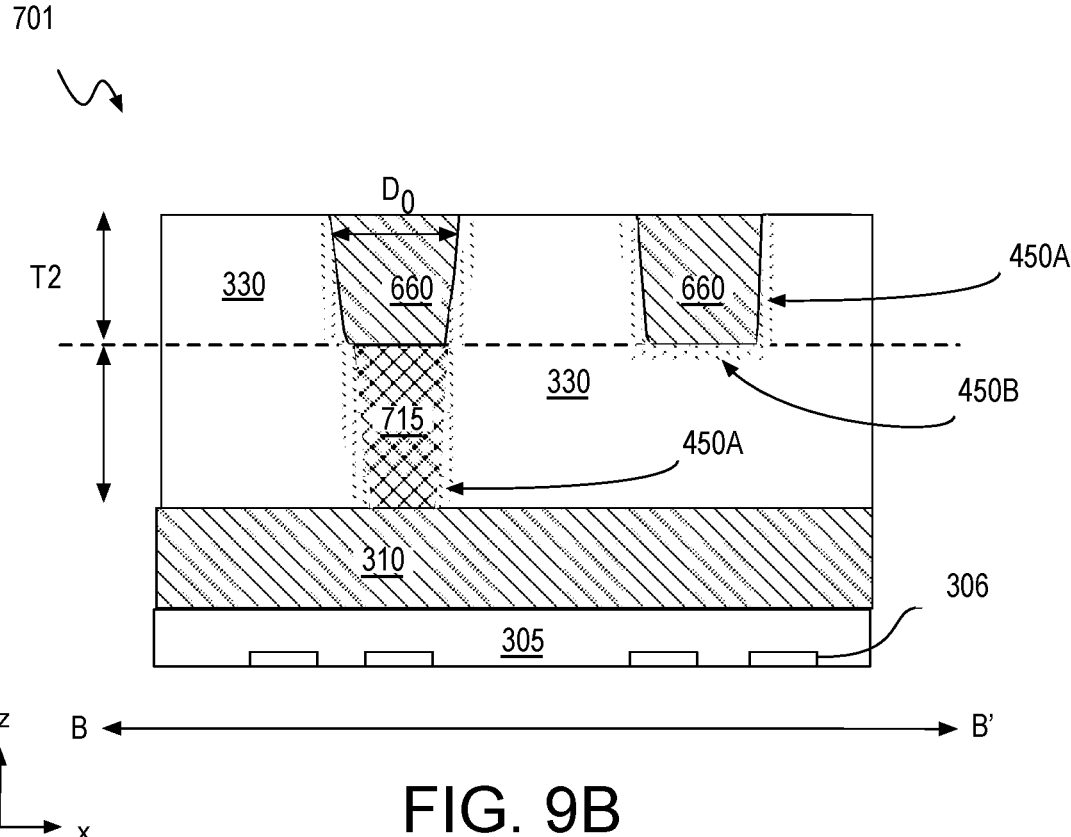

FIGS. 7A, 8A, and 9A illustrate a plan view of a portion of an IC interconnect structure portion 701 evolving as methods 200 are practiced, in accordance with some single-damascene embodiments. FIGS. 7B, 8B and 9B further illustrate a cross-sectional view of a portion of the IC interconnect structure portion 701, in accordance with some embodiments. Reference numbers introduced for IC interconnect structure portion 301 are retained where one or more of the attributes introduced above are also applicable to interconnect structure portion 701.

In FIG. 7A and FIG. 7B, interconnect structure portion 701 includes a via 715 extending through a thickness T1 of dielectric material 330. Via 715 comprises a metal that is electrically coupled to underlying metallization feature 310. Via 715 may have been fabricated according to a first single-damascene process, for example. Via 715 is linerfree, and may comprise a first metal, such as any of those described above (e.g., Ru, Mo, NiAl). Without a liner, the metal is in direct physical contact with metallization feature 310, and in direct physical contact with nitrogen-enriched dielectric sidewall region 450A. A top surface of via 715 is exposed at a bottom of trench 741 patterned into dielectric material 330. A second trench 742 is further illustrated, and is representative of trench 741 out of the plane of via 715. As a result of the separate patterning of via 715 and trench 741, there may be a non-zero lateral offset or profile discontinuity at the interface of the sidewall of trench 741 and a sidewall of via 715.

In the single-damascene example further illustrated in FIG. 8A and FIG. 8B, surfaces of dielectric material 330 are again exposed nitrogen treatment 401, for example substantially as described above. The nitrogen treatment forms nitrogen-enriched dielectric sidewall regions 450A, nitrogen-enriched dielectric trench bottom region 450B, and nitrogen-enriched dielectric top surface region 450C, substantially as described above. In some embodiments, metal of via 715 may also become slightly nitrogen enriched within region 850C.

As further illustrated in FIG. 9A and FIG. 9B, following metal deposition and planarization, interconnect metal feature 660 is again in direct contact with nitrogen-enriched dielectric regions (e.g., 450A and 450B). Interconnect structure 701 is therefore a single damascene structure associated with one level of interconnect metallization comprising a line metallization and via metallization. Interconnect structure 701 may be augmented, for example by iterating methods 200 (FIG. 2), to have any number of levels of interconnect metallization needed for a particular IC.

Figure 10A:
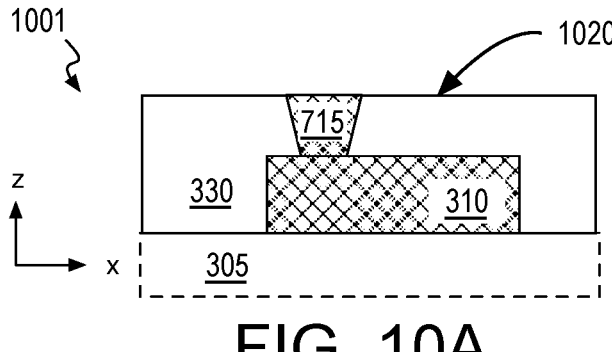
FIGS. 10A, 10B, 10C, and 10D illustrate a cross-sectional view of a portion of an IC interconnect structure evolving as the methods illustrated in FIG. 2 are practiced, in accordance with some subtractive metal patterning embodiments.

FIG. 10A-10D illustrate a cross-sectional view of a portion of an IC interconnect structure evolving as methods 200 (FIG. 2) are practiced, in accordance with some subtractive metal patterning embodiments. Referring first to FIG. 10A, an interconnect structure 1001 includes via 715 embedded within dielectric material 330. Dielectric material 330 has a top surface 1020 that is substantially planar with a top surface of via 715. In some embodiments, top surface 1020 comprises primarily oxygen and silicon, and has less than 1 at. % nitrogen.

Figure 10B:
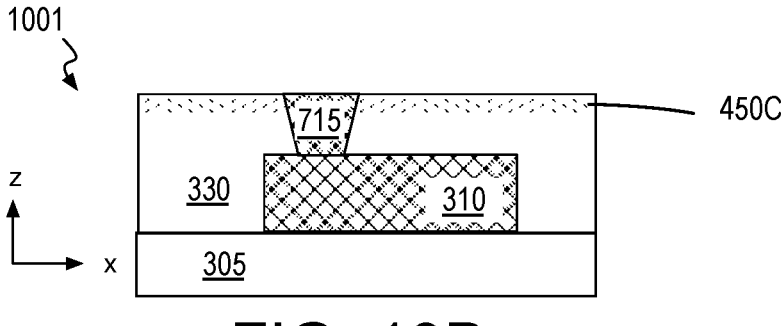
Figure 10C:
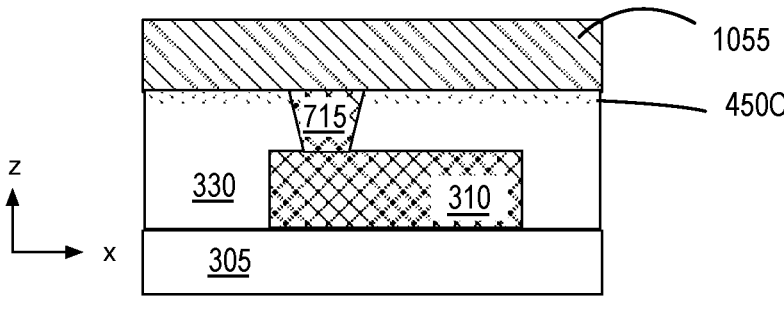
Figure 10D:
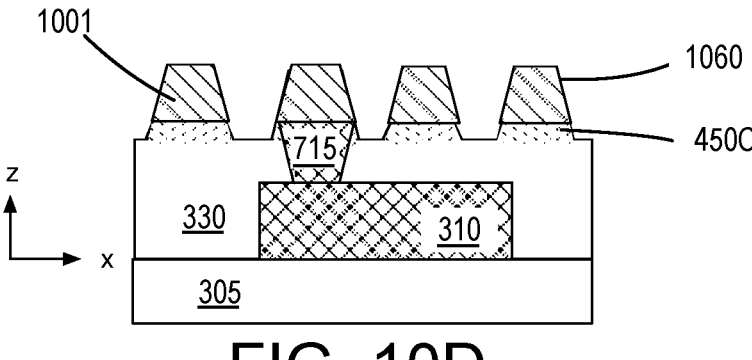

In FIG. 10B, a nitrogen-enriched dielectric surface region 450C is formed with a nitrogen pretreatment, for example substantially as described elsewhere herein. Next, as shown in FIG. 10C, a metal 1055 is deposited in direct contact with via 715, and in direct contact with nitrogen-enriched dielectric surface region 450C. Metal 1055 may be any metal amenable to an etch process, and may be one of those described elsewhere herein (e.g., Ru, Mo, NiAl). As shown in FIG. 10D, metal 1055 is subtractively patterned by practicing any etch process known to be suitable for the particular metal to define interconnect metal features 1060. In this example, an overetch of metal 1055 erodes some of the underlying dielectric material, substantially removing nitrogen-enriched dielectric surface region 450C from between adjacent metal features 1060. Accordingly, nitrogen-enriched dielectric surface region 450C remains only directly under metal features 1060. However, if the etch of metal 1055 has sufficient selectivity, nitrogen-enriched dielectric surface region 450C may remain substantially as illustrated in FIG. 10C.

Although not depicted, any subsequently deposited dielectric material may be deposited over metal features 1060, for example during another iteration of methods 200. This dielectric material will be adjacent to sidewalls of metal features 1060. However, with such dielectric material deposited after the formation of metal features 1060, there will not be a nitrogen-enriched region of dielectric material in direct contact with sidewalls of metal features 1060.

Figure 11:
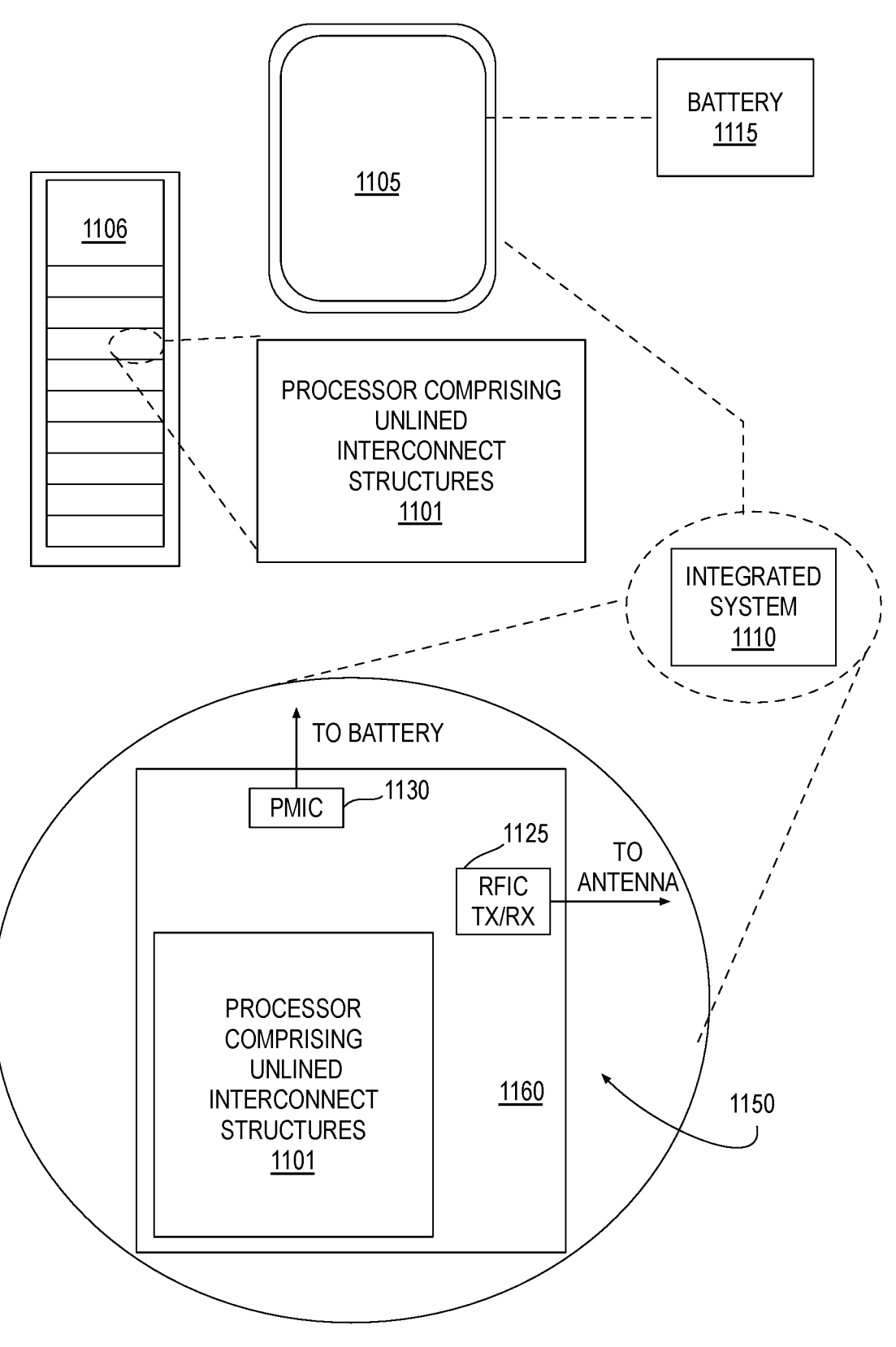
FIG. 11 illustrates a mobile computing platform and a data server machine employing an IC including interconnect structures in accordance with some embodiments.

The interconnect structures described above may be incorporated into any IC. To illustrate a few examples, FIG. 11 depicts a mobile computing platform 1105 and a data server computing platform 1106 employing an IC with interconnect structures that include a metal in direct contact with a nitrogen-enriched dielectric material, for example as described elsewhere herein. The server platform 1106 may be any commercial server, for example including any number of high-performance computing platforms disposed within a rack and networked together for electronic data processing. In one exemplary embodiment, server platform 1106 includes a microprocessor 1101 with interconnect structures that include a metal in direct contact with a nitrogen-enriched dielectric material, for example as described elsewhere herein.

The mobile computing platform 1105 may be any portable device configured for each of electronic data display, electronic data processing, wireless electronic data transmission, or the like. For example, the mobile computing platform 1105 may be any of a tablet, a smart phone, laptop computer, etc., and may include a display screen (e.g., a capacitive, inductive, resistive, or optical touchscreen), a chip-level or package-level integrated system 1110, and a battery 1115. At least one IC of chip-level or package-level integrated system 1110 includes interconnect structures with a metal in direct contact with a nitrogen-enriched dielectric material, for example as described elsewhere herein. In the example shown in expanded view 1150, integrated system 1110 includes microprocessor 1101, which may have interconnect structures that include a metal in direct contact with a nitrogen-enriched dielectric material, for example as described elsewhere herein. Microprocessor 1150 may be further coupled to a board 1160, a substrate, or an interposer. One or more of a power management integrated circuit (PMIC) 1130, or an RF (wireless) integrated circuit (RFIC) 1125 including a wideband RF (wireless) transmitter and/or receiver (TX/RX), may be further coupled to board 1160.

Functionally, PMIC 1130 may perform battery power regulation, DC-to-DC conversion, etc., and so has an input coupled to battery 1115 and with an output providing a current supply to other functional modules (e.g., microprocessor 1150). As further illustrated, in the exemplary embodiment, RFIC 1125 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 4G, 5G, and beyond.

Figure 12:
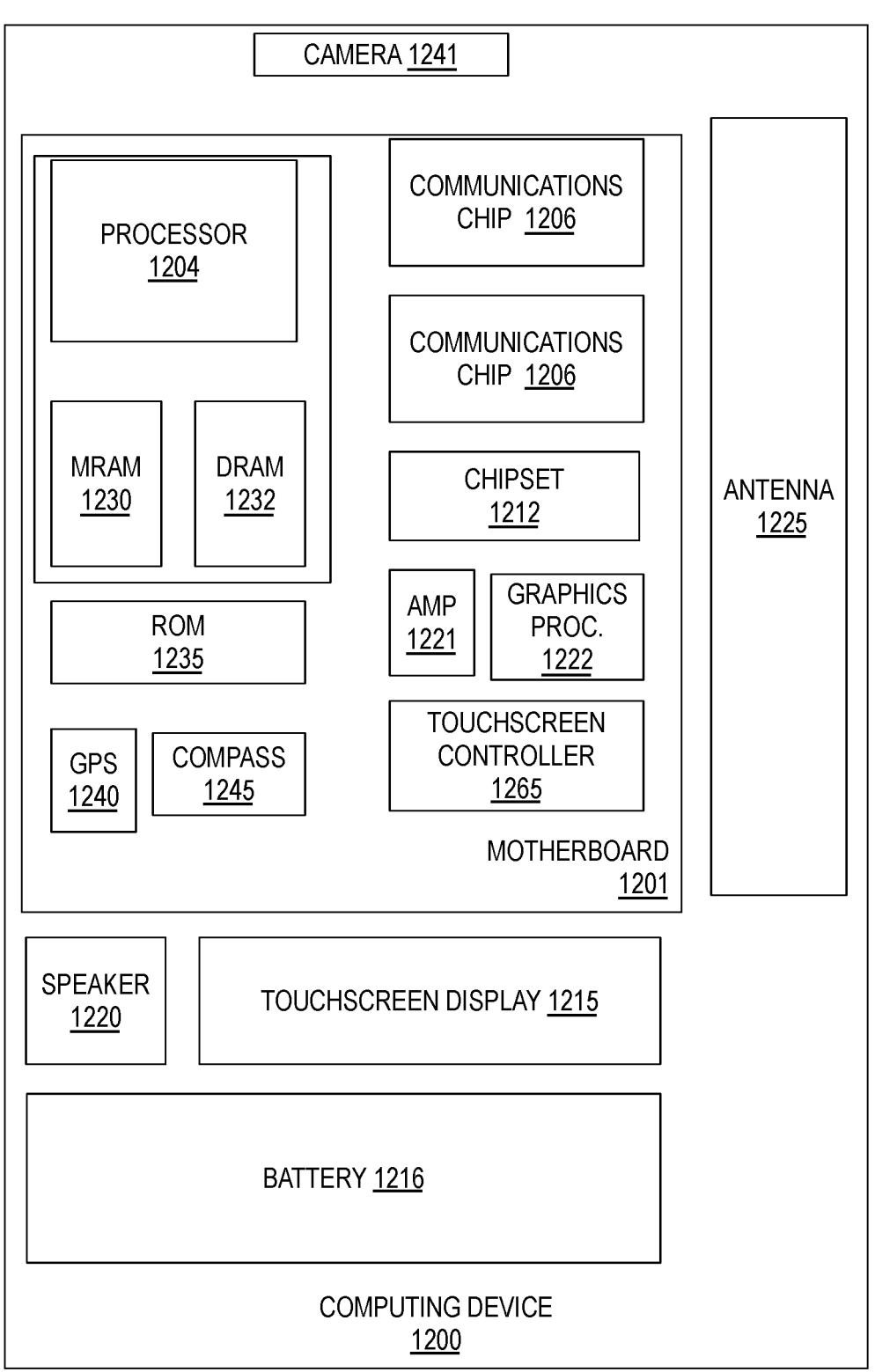
FIG. 12 is a functional block diagram of an electronic computing device, in accordance with some embodiments.

FIG. 12 is a functional block diagram of an electronic computing device 1200, in accordance with an embodiment of the present invention. Computing device 1200 may be found inside platform 1105 or server platform 1106, for example. Device 1200 further includes a motherboard 1201 hosting a number of components, such as, but not limited to, a processor 1204 (e.g., an applications processor). Processor 1204 may be physically and/or electrically coupled to motherboard 1201. In some examples, processor 1204 includes interconnect structures with a metal in direct contact with a nitrogen-enriched dielectric material, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1206 may also be physically and/or electrically coupled to the motherboard 1201. In further implementations, communication chips 1206 may be part of processor 1204. Depending on its applications, computing device 1200 may include other components that may or may not be physically and electrically coupled to motherboard 1201. These other components include, but are not limited to, volatile memory (e.g., DRAM 1232), non-volatile memory (e.g., ROM 1235), flash memory (e.g., NAND or NOR), magnetic memory (MRAM 1230), a graphics processor 1222, a digital signal processor, a crypto processor, a chipset 1212, an antenna 1225, touchscreen display 1215, touchscreen controller 1265, battery 1216, audio codec, video codec, power amplifier 1221, global positioning system (GPS) device 1240, compass 1245, accelerometer, gyroscope, speaker 1220, camera 1241, and mass storage device (such as hard disk drive, solid-state drive (SSD), compact disk (CD), digital versatile disk (DVD), and so forth), or the like. In some exemplary embodiments, at least one of the functional blocks noted above include interconnect structures with a metal in direct contact with a nitrogen-enriched dielectric material, for example as described elsewhere herein.

Communication chips 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1206 may implement any of a number of wireless standards or protocols, including but not limited to those described elsewhere herein. As discussed, computing device 1200 may include a plurality of communication chips 1206. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

It will be recognized that the invention is not limited to the embodiments described above, but can be practiced with modification and alteration without departing from the scope of the appended claims. For example, the above embodiments may include specific combinations of features as further provided below.

In first examples, an integrated circuit (IC) structure comprises a line or via comprising a metal with less than 1 at. % nitrogen, and a dielectric material in direct contact with the metal along an interface of the line or via. Nitrogen content with the dielectric material increases with proximity to the interface.

In second examples, for any of the first examples the line or via consists of the metal.

In third examples, for any of the first through second examples the metal comprises at least one of Ru, Mo, or Ni.

In fourth examples, for any of the first through third examples the metal is substantially pure Ru or substantially pure Mo.

In fifth examples, for any of the first through fourth examples, the metal is substantially pure Ru.

In sixth examples, for any of the first through third examples the metal is an alloy of Ni and Al.

In seventh examples, for any of the first through sixth examples within 10 nm of the interface, the nitrogen content within the dielectric material is more than 1 at. %, and beyond 10 nm from the interface, the nitrogen content within the dielectric material is less than 1 at. %.

In eighth examples, for any of the first through seventh examples the nitrogen content within the dielectric material peaks at no more than 10 at. %.

In ninth examples, for any of the first through eighth examples the dielectric material comprises silicon and oxygen.

In tenth examples, for any of the first through ninth examples the nitrogen content within the metal over the distance in a second direction from the interface is lower than that of the dielectric material.

In eleventh examples, for any of the first through tenth examples the line or via is in contact with an underlying second line or via comprising a second metal, and nitrogen content within the second metal increases with proximity to a second interface between the metal and the second metal.

In twelfth examples, for any of the eleventh examples the second metal is different than the first metal, a second dielectric material is in direct contact with the metal along a third interface of the second line or via. Nitrogen content within the second dielectric material also increases with proximity to the third interface.

In thirteenth examples, for any of the first through eleventh examples the line or via is a line and the interface is under the line, a second dielectric material is in direct contact with the metal along a sidewall of the line, and wherein nitrogen content within the second dielectric material does is independent of proximity to the interface.

In fourteenth examples, a computer platform comprises a power supply, and an integrated circuit (IC) coupled to the power supply. The IC comprises a device layer comprising a plurality of transistors comprising one or more semiconductor materials, and an interconnect level. The interconnect level further comprises a line or via coupled to one or more of the transistors. The line or via comprises a metal with less than 1 at. % nitrogen. The interconnect level comprises a dielectric material in direct contact with the metal along an interface of the line or via. The chemical composition of the dielectric material comprises silicon and oxygen, and is more nitrogen rich proximal to the interface than distal from the interface.

In fifteenth examples, for any of the fourteenth examples the IC comprises a microprocessor.

In sixteenth examples, a method of fabricating an integrated circuit (IC) structure comprises depositing a dielectric material, introducing nitrogen into the dielectric material through a surface of the dielectric material, depositing a metal in contact with the surface of the dielectric material, patterning the metal into an interconnect feature.

In seventeenth examples, for any of the sixteenth examples introducing the nitrogen comprises exposing the surface of the dielectric material to at least one of a nitrogen species activated by plasma of a source gas comprising nitrogen, a thermal or laser anneal performed in the presence of the source gas comprising nitrogen, or electron or ion beam radiation in the present of the gas comprising nitrogen.

In eighteenth examples, for any of the seventeenth examples the source gas comprising nitrogen comprises at least one of $N_2$, $N_2O$, $NH_3$, $N_2H_4$, $N_2{:}H_2$ forming gas.

In nineteenth examples, for any of the sixteenth through eighteenth examples depositing the dielectric material comprises depositing a compound comprising less than 1% nitrogen, and introducing nitrogen into the dielectric material increases a content of the nitrogen within the dielectric material to more than 1 at. % proximal to the surface.

In twentieth examples, for any of the nineteenth examples introducing nitrogen into the dielectric material increases a content of the nitrogen within the dielectric material to no more than 10 at. % within 10 nm of the surface.

In twenty-first examples, for any of the sixteenth through twentieth examples depositing the metal comprises depositing substantially pure Ru or substantially pure Mo.

In twenty-second examples, for any of the sixteenth through twenty-first examples the method further comprises forming at least one of a via opening or a trench in the dielectric material. Introducing the nitrogen into the dielectric material comprises introducing nitrogen into the dielectric material through a surface of the via opening or the trench. Depositing the metal comprises depositing the metal into the via opening or the trench, and patterning the metal comprises planarizing the metal with the dielectric material.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC) structure, comprising:
a liner-free line or via consisting essentially of a single metal having less than 1 at. % nitrogen, wherein the single metal is Ru or Mo; and
a dielectric material in direct contact with the single metal along an interface of the line or via, wherein nitrogen content within the dielectric material increases with proximity to the interface.

2. The IC structure of claim 1, wherein the line or via is substantially pure Ru or substantially pure Mo.

3. The IC structure of claim 2, wherein the line or via is substantially pure Mo.

4. The IC structure of claim 1, wherein:
within 10 nm of the interface, the nitrogen content within the dielectric material is more than 1 at. %; and
beyond 10 nm from the interface, the nitrogen content within the dielectric material is less than 1 at. %.

5. The IC structure of claim 4, wherein the nitrogen content within the dielectric material peaks at no more than 10 at. %.

6. The IC structure of claim 5, wherein the dielectric material comprises silicon and oxygen.

7. The IC structure of claim 1, wherein the nitrogen content within the metal over a distance in a second direction from the interface is lower than that of the dielectric material.

8. The IC structure of claim 1, wherein:
the single metal is a first metal;
the line or via is in contact with an underlying second line or via comprising a second metal; and
nitrogen content within the second metal increases with proximity to a second interface between the first metal and the second metal.

9. The IC structure of claim 8, wherein;
the second metal is different than the first metal;
a second dielectric material is in direct contact with the first metal along a third interface of the second line or via, wherein nitrogen content within the second dielectric material also increases with proximity to the third interface.

10. The IC structure of claim 1, wherein:
the line or via is a line and the interface is under the line;
a second dielectric material is in direct contact with the metal along a sidewall of the line, and wherein nitrogen content within the second dielectric material is independent of proximity to the sidewall of the line.

11. A computer platform comprising:
a power supply; and
an integrated circuit (IC) coupled to the power supply, wherein the IC comprises:
a device layer comprising a plurality of transistors comprising one or more semiconductor materials; and
an interconnect level, the interconnect level further comprising:
a line or via coupled to one or more of the transistors, wherein the line or via consists of substantially pure Ru or Mo comprising less than 1 at. % nitrogen;
a dielectric material in direct contact with the Ru or Mo along an interface of the line or via, wherein the dielectric material comprises silicon and oxygen, and is more nitrogen rich proximal to the interface than distal from the interface.

12. The computer platform of claim 11, wherein the IC comprises a microprocessor.

* * * * *